US012635333B2

(12) United States Patent
Jia et al.

(10) Patent No.: US 12,635,333 B2
(45) Date of Patent: May 19, 2026

(54) DISPLAY SUBSTRATE, METHOD OF MANUFACTURING THEREOF AND DISPLAY DEVICE

(71) Applicants: Hefei BOE Joint Technology Co., Ltd., Hefei (CN); BOE Technology Group Co., Ltd., Beijing (CN)

(72) Inventors: Wenbin Jia, Beijing (CN); Kangjian Miao, Beijing (CN); Xiaoning Liu, Beijing (CN)

(73) Assignees: Hefei BOE Joint Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 406 days.

(21) Appl. No.: 18/265,962

(22) PCT Filed: Jun. 6, 2022

(86) PCT No.: PCT/CN2022/097217
§ 371 (c)(1),
(2) Date: Jun. 7, 2023

(87) PCT Pub. No.: WO2023/236015
PCT Pub. Date: Dec. 14, 2023

(65) Prior Publication Data
US 2024/0373664 A1 Nov. 7, 2024

(51) Int. Cl.
*H10K 50/17* (2023.01)
*H10K 59/12* (2023.01)
*H10K 59/122* (2023.01)

(52) U.S. Cl.
CPC ....... *H10K 50/171* (2023.02); *H10K 59/1201* (2023.02); *H10K 59/122* (2023.02)

(58) Field of Classification Search
CPC . H10K 50/171; H10K 59/1201; H10K 59/122
See application file for complete search history.

(56) References Cited

U.S. PATENT DOCUMENTS

2011/0031480 A1 2/2011 Nakamura et al.
2011/0108877 A1 5/2011 Yamada et al.
(Continued)

FOREIGN PATENT DOCUMENTS

CN 101997086 A 3/2011
CN 102054937 A 5/2011
(Continued)

OTHER PUBLICATIONS

PCT/CN2022/097217 international search report.
PCT/CN2022/097217 Written Opinion.
CN2022800016695 first office action dated Nov. 26, 2025.

*Primary Examiner* — Anne M Hines
(74) *Attorney, Agent, or Firm* — IPro, PLLC

(57) ABSTRACT

The present application relates to a display substrate, a method of manufacturing thereof and a display device. The display substrate includes a base and sub-pixels on the base. Each of the sub-pixels includes a light-emitting device. The light-emitting device includes an anode layer, a light-emitting material layer, an electron transport layer, an electron injection layer and a cathode layer; the light-emitting device includes at least one electron injection layer, and the light-emitting device further includes at least one high impedance layer. The high impedance layer includes a first high impedance film layer, at least one second high impedance film layer located between the first high impedance film layer and the cathode layer, and at least one third high impedance film layer located between the first high impedance film layer and the electron injection layer.

18 Claims, 3 Drawing Sheets

(56) References Cited

U.S. PATENT DOCUMENTS

| | | | | |
|---|---|---|---|---|
| 2011/0121346 | A1 | 5/2011 | Yamada et al. | |
| 2013/0256639 | A1* | 10/2013 | Kambe .................. | H10K 71/00 257/40 |
| 2023/0146536 | A1 | 5/2023 | Hu et al. | |

FOREIGN PATENT DOCUMENTS

| | | | |
|---|---|---|---|
| CN | 102113415 | A | 6/2011 |
| CN | 103367650 | A | 10/2013 |
| CN | 110323343 | A | 10/2019 |
| CN | 111162184 | A | 5/2020 |
| CN | 111463353 | A | 7/2020 |
| CN | 114068845 | A | 2/2022 |
| CN | 115411199 | A | 11/2022 |
| JP | 2010186637 | A | 8/2010 |
| JP | 2012049085 | A | 3/2012 |

* cited by examiner

DISPLAY SUBSTRATE, METHOD OF MANUFACTURING THEREOF AND DISPLAY DEVICE

CROSS-REFERENCE TO RELATED APPLICATIONS

This application is a national stage of international PCT Application No. PCT/CN2022/097217 filed on Jun. 6, 2022, the entire contents of which are incorporated herein by reference.

TECHNICAL FIELD

The present application relates to the technology field of display, and in particular, to a display substrate, a method of manufacturing thereof and a display device.

BACKGROUND

OLED (Organic Light Emitting Diode) belongs to an electroluminescent device, which has features of self-illumination, high luminous efficiency, low operating voltage, light weight and thinness, flexibility, simple manufacturing process, etc., and is widely used in fields of display and lighting.

In related art, in a process of manufacturing an OLED display device, due to the presence of microscopic particles in a device cavity, it is easy to cause a short circuit problem of sub-pixels in a light-emitting region of the display device, resulting in the generation of dark spots in the light-emitting region, and affecting the display effect of the display device.

SUMMARY

The present application provides a display substrate, a method of manufacturing thereof and a display device.

According to a first aspect of examples of the present application, a display substrate is provided. The display substrate includes: a base and sub-pixels located on the base, each of the sub-pixels including a light-emitting device, the light-emitting device includes an anode layer, a light-emitting material layer, an electron transport layer, an electron injection layer and a cathode layer that are arranged sequentially; the light-emitting device includes at least one electron injection layer, and the light-emitting device further includes at least one high impedance layer located between the electron injection layer and the cathode layer;

for one of the at least one high impedance layer, the high impedance layer includes a first high impedance film layer, a second high impedance film layer between the first high impedance film layer and the cathode layer, and a third high impedance film layer between the first high impedance film layer and the electron injection layer; a resistivity of the first high impedance film layer is respectively higher than a resistivity of the second high impedance film layer and a resistivity of the third high impedance film layer; the resistivity of the first high impedance film layer, the resistivity of the second high impedance film layer, and the resistivity of the third high impedance film layer are respectively higher than a resistivity of the cathode layer and a resistivity of the electron injection layer.

In an example, a thickness of the first high impedance film layer is respectively larger than a thickness of the second high impedance film layer and a thickness of the third high impedance film layer.

In an example, the thickness of the first high impedance film layer is in a range from 50 nm to 200 nm, the thickness of the second high impedance film layer is in a range from 5 nm to 10 nm, and the thickness of the third high impedance film layer is in a range from 5 nm to 10 nm.

In an example, when one high impedance layer includes two or more second high impedance film layers, in the high impedance layer, resistivities of the two or more second high impedance film layers are gradually increased in a direction from the cathode layer to the first high impedance film layer.

In an example, when one high impedance layer includes two or more third high impedance film layers, in the high impedance layer, resistivities of the two or more third high impedance film layers are gradually decreased in a direction from the cathode layer to the first high impedance film layer.

In an example, materials for the first high impedance film layer, the second high impedance film layer and the third high impedance film layer are same.

In an example, materials for the first high impedance film layer, the second high impedance film layer and the third high impedance film layer are selected from at least one of zinc oxide, titanium oxide, tin oxide or indium oxide.

In an example, when a number of the electron injection layer and a number of the high impedance layer are both greater than or equal to two, the electron injection layers and the high impedance layers are alternately arranged.

In an example, the resistivity of the first high impedance film layer is in a range from $10^4$ Ω*cm to 106 Ω*cm, and the resistivity of the second high impedance film layer and the resistivity of the third high impedance film layer are in a range from $10^2$ Ω*cm to $10^3$ Ω*cm respectively.

In an example, an absolute value of a work function of the cathode layer is in a range from 3.6 eV to 4.2 eV, an absolute value of a work function of the first high impedance film layer is in a range from 5.2 eV to 6.0 eV, and absolute values of work functions of the second high impedance film layer and the third high impedance film layer are in a range from 4.5 eV to 5.2 eV respectively.

According to a second aspect of the examples of the present application, a display substrate is provided. The display substrate includes: a base, and a pixel defining layer and a plurality of sub-pixels on the base, where the pixel defining layer includes first defining portions along a first direction and second defining portions along a second direction, where the first direction intersects the second direction; a distances from a surface of one of the first defining portions away from the base to the base are greater than a distance from a surface of one of the second defining portions away from the base to the base; by the first defining portions and the second defining portions form a plurality of pixel openings that define light-emitting regions of the sub-pixels are formed;

one of the sub-pixels includes a light-emitting device, and the light-emitting device includes an anode layer, a hole injection layer, a hole transport layer, a light-emitting material layer, an electron transport layer, an electron injection layer and a cathode layer that are arranged sequentially; the hole injection layer, the hole transport layer, and the light-emitting material layer of the one of the sub-pixels are between two adjacent first defining portions; hole injection layers of the sub-pixels between the two adjacent first defining portions are connected with each other; hole transport layers of the sub-pixels between the two adjacent first defining portions are connected with each other; light-emitting material layers of the sub-pixels between the two adjacent first defining portions are connected with each other;

the light-emitting device includes at least one electron injection layer, and the light-emitting device further includes at least one high impedance layer between the electron injection layer and the cathode layer; for one of the at least one electron injection layer, the high impedance layer includes a first high impedance film layer, a second high impedance film layer between the first high impedance film layer and the cathode layer, and a third high impedance film layer between the first high impedance film layer and the electron injection layer; a resistivity of the first high impedance film layer is respectively higher than a resistivity of the second high impedance film layer and a resistivity of the third high impedance film layer; the resistivity of the first high impedance film layer, the resistivity of the second high impedance film layer, and the resistivity of the third high impedance film layer are respectively higher than a resistivity of the cathode layer and a resistivity of the electron injection layer.

In an example, a thickness of the first high impedance film layer is respectively larger than a thickness of the second high impedance film layer and a thickness of the third high impedance film layer.

In an example, when the high impedance layer includes two or more second high impedance film layers, in the high impedance layer, resistivities of the two or more second high impedance film layers are gradually increased in a direction from the cathode layer to the first high impedance film layer; and/or when the high impedance layer includes two or more third high impedance film layers, in the high impedance layer, resistivities of the two or more third high impedance film layers are gradually decreased in the direction from the cathode layer to the first high impedance film layer.

In an example, materials for the first high impedance film layer, the second high impedance film layer and the third high impedance film layer are same.

In an example, when a number of the electron injection layer and a number of the high impedance layer are both greater than or equal to two, the electron injection layers and the high impedance layers are alternately arranged.

According to a third aspect of the examples of the present application, a method of manufacturing a display substrate is provided. The method of manufacturing a display substrate includes:

providing a base;

forming a light-emitting device located on the base;

forming the light-emitting device located on the base includes: sequentially forming an anode layer, a light-emitting material layer, an electron transport layer, an electron injection layer, a high impedance layer and a cathode layer; the light-emitting device includes at least one electron injection layer and at least one high impedance layer, the at least one high impedance layer is located between the electron injection layer and the cathode layer;

forming one of the at least one high impedance layer includes: sequentially forming a third high impedance film layer, a first high impedance film layer located on a side of the third high impedance film layer away from the anode layer, and a second high impedance film layer located on a side of the first high impedance film layer away from the anode layer; where a resistivity of the first high impedance film layer is respectively higher than a resistivity of the second high impedance film layer and a resistivity of the third high impedance film layer; the resistivity of the first high impedance film layer, the resistivity of the second high impedance film layer, and the resistivity of the third high impedance film layer are respectively higher than a resistivity of the cathode layer and a resistivity of the electron injection layer.

In an example, each film layer of the high impedance layer is formed through sputtering.

In an example, in a sputtering process of manufacturing the first high impedance film layer, a proportion of oxygen in sputtering gases is a first proportion; in a sputtering process of manufacturing the second high impedance film layer, a proportion of oxygen in the sputtering gases is a second proportion; and in a sputtering process of manufacturing the third high impedance film layer, a proportion of oxygen in the sputtering gases is a third proportion, where the first proportion is respectively greater than the second proportion and the third proportion; and/or a power density used in the sputtering process of manufacturing the first high impedance film layer is a first power density; a power density used in the sputtering process of manufacturing the second high impedance film layer is a second power density; and a power density used in the sputtering process of manufacturing the third high impedance film layer is a third power density, where the first power density is respectively smaller than the second power density and the third power density.

According to a fourth aspect of the examples of the present application, a display device is provided. The display device includes the display substrate as described above.

For the display substrate, its manufacturing method and the display device provided in the examples of the present application, the light-emitting device includes at least one high impedance layer, where the resistivity of each film layer of the high impedance layer is higher than the resistivity of each layer which is adjacent with the high impedance layer. The high impedance layer can modify a periphery of a particle of the light-emitting device, increasing a resistance between the anode layer and the cathode layer at a location where a short circuit is more likely to occur due to the presence of the particle, and thereby greatly alleviating a short circuit problem due to the presence of the particle, effectively reducing a number of dark spots generated on the display substrate, and improving a product yield of the display substrate. In the high impedance layer, the resistivity of at least one second high impedance film layer between the first high impedance film layer and the cathode layer is lower than the resistivity of the first high impedance film layer, and the resistivity of at least one third high impedance film layer between the first high impedance film layer and the electron injection layer is lower than the resistivity of the first high impedance film layer, so that a change of a work function from the electron injection layer to the cathode layer is more gentle, which can reduce a difficulty of injecting electrons from the cathode layer to the electron injection layer, increase an electron transport rate, and alleviate high driving voltage and low optical performance problems of a light-emitting substrate due to a low electron transport rate.

DETAILED DESCRIPTION OF THE EMBODIMENTS

Figure 1:
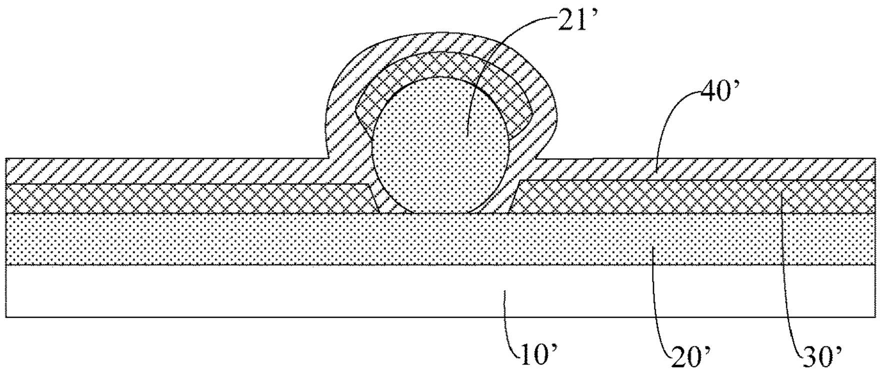
FIG. 1 is a schematic diagram illustrating a principle of a short circuit problem of sub-pixels due to the presence of a particle in an OLED display device.

Examples will be described in detail herein, with the illustrations thereof represented in the drawings. When the following descriptions involve the drawings, like numerals in different drawings refer to like or similar elements unless otherwise indicated. The embodiments described in the following examples do not represent all embodiments consistent with the present application. Rather, they are merely examples of devices and methods consistent with some aspects of the present application as detailed in the appended claims.

The terms used in the present application are for the purpose of describing particular examples only, and are not intended to limit the present application. Terms determined by "a", "the" and "said" in their singular forms in the present application and the appended claims are also intended to include plurality, unless clearly indicated otherwise in the context. It should also be understood that the term "and/or" as used herein refers to and includes any or all possible combinations of one or more of the associated listed items.

It is to be understood that, although terms "first," "second," "third," and the like may be used in the present application to describe various information, such information should not be limited to these terms. These terms are only used to distinguish one category of information from another. For example, without departing from the scope of the present application, first information may be referred as second information; and similarly, second information may also be referred as first information. Depending on the context, the word "if" as used herein may be interpreted as "when" or "upon" or "in response to determining".

FIG. 1 is a schematic diagram illustrating a principle of a short circuit problem of sub-pixels due to the presence of a particle in an OLED display device. The OLED display device includes a base 10', an anode layer 20', an organic light-emitting layer 30' and a cathode layer 40', where the organic light-emitting layer 30' is manufactured through evaporation. As shown in FIG. 1, no organic light-emitting layer is formed at a bottom corner of a particle 21', or thicknesses of the organic light-emitting layer 30' and the cathode layer 40' at the bottom corner of the particle 21' are smaller. During the working of the OLED display device, when no organic light-emitting layer is formed at the bottom corner of the particle 21', the anode layer and the cathode layer at this location directly contact and are short-circuited. When the thickness of the organic light-emitting layer 30' at the bottom corner of the particle is smaller, during the working of the OLED display device, the organic light-emitting layer 30' at the bottom corner of the particle is burned, resulting in that the cathode layer and the anode layer at this location contact and are short-circuited. When the cathode layer and the anode layer are short-circuited, a dark spot will be generated on the display substrate.

Figure 2:
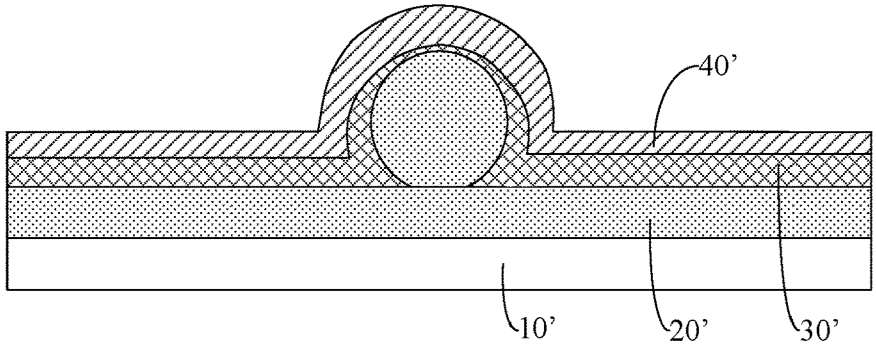
FIG. 2 is a schematic diagram illustrating a principle of a short circuit problem of sub-pixels due to the presence of a particle in another OLED display device.

FIG. 2 is a schematic diagram illustrating a principle of a short circuit problem of sub-pixels due to the presence of a particle in another OLED display device. The OLED display device includes a base 10', an anode layer 20', an organic light-emitting layer 30' and a cathode layer 40', where the organic light-emitting layer 30' is manufactured through inkjet printing. As shown in FIG. 1, a thickness of the organic light-emitting layer 30' at a top of a particle 21' is smaller. During the working of the OLED display device, the organic light-emitting layer 30' at the top of the particle 21' is easily burned, resulting in that the cathode layer and the anode layer at this location contact and are short-circuited, and thus, a dark spot is generated.

In the examples of the present application, a display substrate and manufacturing method of the display substrate, and a display device are provided to solve the above technical problems. The display substrate and manufacturing method of the display substrate, and the display device in the examples of the present application will be described in detail below with reference to the accompanying drawings. Features in the following examples may be supplemented or combined with each other in a case of no conflict.

Example 1

Figure 3:
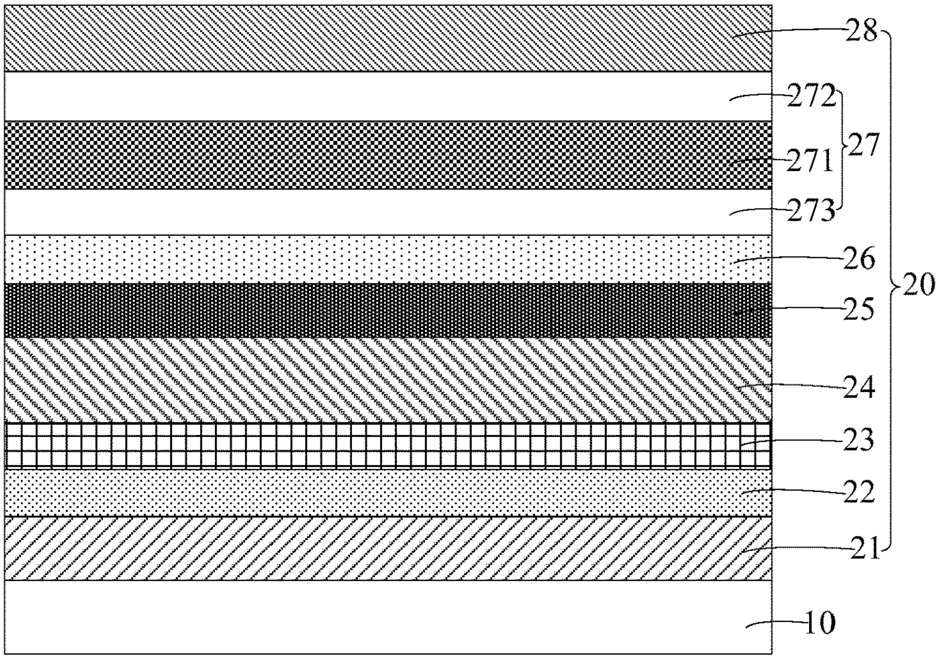
FIG. 3 is a cross-sectional view illustrating a display substrate according to an example of the present application.
Figure 4:
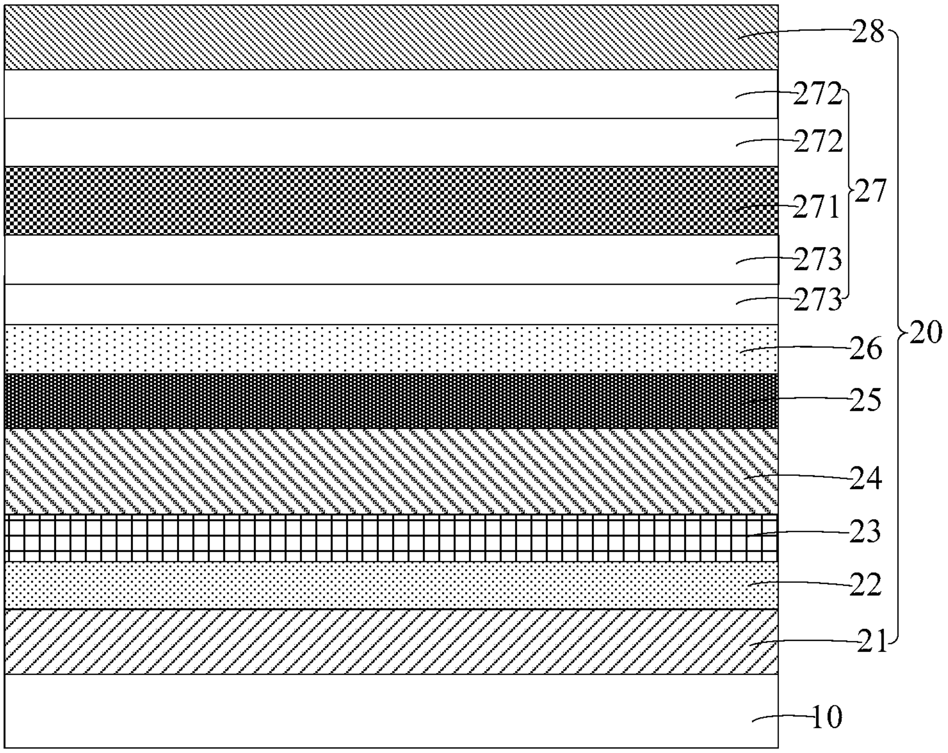
FIG. 4 is a cross-sectional view illustrating a display substrate according to another example of the present application.
Figure 5:
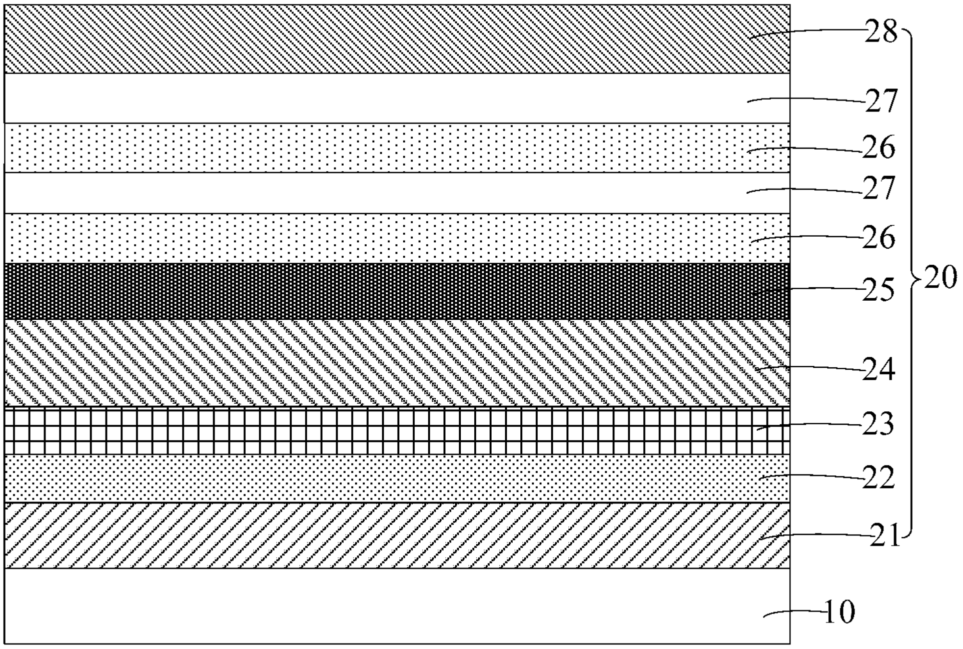
FIG. 5 is a cross-sectional view illustrating a display substrate according to another example of the present application.

In the example of the present application, a display substrate is provided. As shown in FIGS. 3-5, the display substrate includes a base 10 and sub-pixels on the base 10. Each of the sub-pixels includes a light-emitting device 20.

The light-emitting device 20 includes an anode layer 21, a hole injection layer 22, a hole transport layer 23, a light-emitting material layer 24, an electron transport layer 25, an electron injection layer 26 and a cathode layer 28 that are arranged sequentially. The light-emitting device 20 includes at least one electron injection layer 26, and the light-emitting device 20 further includes at least one high impedance layer 27 between the electron injection layer 26 and the cathode layer 28.

The high impedance layer 27 includes a first high impedance film layer 271, at least one second high impedance film layer 272 between the first high impedance film layer 271 and the cathode layer 28, and at least one third high impedance film layer 273 between the first high impedance film layer 271 and the electron injection layer 26. A resistivity of the first high impedance film layer 271 is respectively higher than a resistivity of the second high impedance film layer 272 and a resistivity of the third high impedance film layer 273. The resistivity of the first high impedance film layer 271, the resistivity of the second high impedance film layer 272, and the resistivity of the third high impedance film layer 273 are respectively higher than a resistivity of the cathode layer 28 and a resistivity of the electron injection layer 26.

For the display substrate provided in the example of the present application, the light-emitting device 20 includes at least one high impedance layer 27, where the resistivity of each film layer of the high impedance layer 27 is higher than the resistivity of each layer which is adjacent with the high impedance layer, that is, the resistivity of each film layer of the high impedance layer 27 is higher than the resistivity of the electron injection layer 26 and the resistivity of the cathode layer 28. The high impedance layer 27 can modify a periphery of a particle of the light-emitting device, increasing a resistance between the anode layer 21 and the cathode layer 28 at a location where a short circuit is more likely to occur due to the presence of the particle, and thereby greatly alleviating a short circuit problem due to the presence of the particle, effectively reducing a number of dark spots generated on the display substrate, and improving a product yield of the display substrate. In the high impedance layer 27, the resistivity of at least one second high impedance film layer 272 between the first high impedance film layer 271 and the cathode layer 28 is lower than the resistivity of the first high impedance film layer 271, and the resistivity of at least one third high impedance film layer 273 between the first high impedance film layer 271 and the electron injection layer 26 in the high impedance layer 27 is lower than the resistivity of the first high impedance film layer 271, so that both a work function difference between the cathode layer 28 and the second high impedance film layer 272 and a work function difference between the first high impedance film layer 271 and the second high impedance film layer 272 are smaller than a work function difference between the cathode layer 28 and the first high impedance film layer 271. Both a work function difference between the first high impedance film layer 271 and the third high impedance film layer 273 and a work function difference between the third high impedance film layer 273 and the electron injection layer 26 are smaller than a work function difference between the first high impedance film layer 271 and the electron injection layer 26. That is, the change of a work function from the electron injection layer 26 to the cathode layer 28 is more gentle, which can reduce a difficulty of injecting electrons from the cathode layer 28 to the first high impedance film layer 271 and a difficulty of injecting electrons from the first high impedance film layer 271 to the electron injection layer 26, increase an electron transport rate, and alleviate high driving voltage and low optical performance problems of a light-emitting substrate due to a low electron transport rate.

In an example, as shown in FIGS. 3 and 4, the display substrate includes one electron injection layer 26 and one high impedance layer 27 between the electron injection layer 26 and the cathode layer 28.

In another example, when a number of the electron injection layer 26 and a number of the high impedance layer 27 are greater than or equal to two respectively, the electron injection layers 26 and the high impedance layers 27 are alternately arranged. With such arrangement, an effect of the high impedance layer 27 on modifying the particle in the sub-pixel can be made better, which is more helpful to alleviate the short circuit problem of sub-pixels due to the presence of the particle in the sub-pixel. Moreover, with such arrangement, a thickness of each of the electron injection layers 26 and the high impedance layers 27 can be set smaller, and the change of the work function from the electron injection layer 26 to the cathode layer 28 is more gentle, which is more conducive to electron injection and transport. In the example shown in FIG. 5, the light-emitting device 20 of the display substrate includes two electron injection layers 26 and two high impedance layers 27, and each of the high impedance layers 27 is on a side of the electron injection layer 26 toward the cathode layer 28. In other examples, the light-emitting device 20 of the display substrate may include three or more electron injection layers 26 and three or more high impedance layers 27.

In an example, a thickness of the first high impedance film layer 271 is larger than a thickness of the second high impedance film layer 272 and a thickness of the third high impedance film layer 273. Since the resistivity of the first high impedance film layer 271 is respectively higher than the resistivity of the second high impedance film layer 272 and the resistivity of the third high impedance film layer 273, the larger the thickness of the first high impedance film layer 271 is, the higher a resistance of the first high impedance film layer 271 is, and the better the effect on alleviating the short circuit problem of sub-pixels is. By setting the thickness of the first high impedance film layer 271 to be larger than the thickness of the second high impedance film layer 272 and the thickness of the third high impedance film layer 273, the resistance at a location where a short circuit is more likely to occur in the sub-pixel can be effectively increased, and the number of dark spots generated on the display substrate can be effectively reduced.

In some examples, the thickness of the first high impedance film layer 271 is in a range from 50 nm to 200 nm, the thickness of the second high impedance film layer 272 is in a range from 5 nm to 10 nm, and the thickness of the third high impedance film layer 273 is in a range from 5 nm to 10 nm. With such arrangement, not only a resistance of the high impedance layer 27 between the cathode layer 28 and the anode layer 21 at a location where a short circuit is more likely to occur in the sub-pixel can be effectively increased, and the change of a work function from the electron injection layer 26 to the cathode layer 28 is more gentle, but also it can be avoided that the arrangement of the high impedance layer 27 makes a thickness of the display substrate increased too much, which is not helpful to achieve the thinning of the display substrate. In some examples, the thickness of the first high impedance film layer 271 is, for example, 50 nm, 100 nm, 150 nm or 200 nm, the thickness of the second high impedance film layer 272 is, for example, 5 nm, 7 nm, 8 nm or 10 nm, and the thickness of the third high impedance film layer 273 is, for example, 5 nm, 7 nm, 8 nm or 10 nm.

In an example, as shown in FIG. 3, the high impedance layer includes one second high impedance film layer 272 and one third high impedance film layer 273.

In another example, as shown in FIG. 4, the high impedance layer 27 includes two or more second high impedance film layers 272. In the same high impedance layer 27, resistivities of the second high impedance film layers 272 are gradually increased in a direction from the cathode layer 28 to the first high impedance film layer 271. With such arrangement, the two or more second high impedance film layers 272 can make the change of a work function from the cathode layer 28 to the first high impedance film layer 271 more gentle, which is more helpful to reduce a difficulty of injection and transport for electron, and increase an electron transport rate. In the example shown in FIG. 4, the high impedance layer 27 includes two second high impedance film layers 272. In other examples, the high impedance layer 27 may include three or more second high impedance film layers 272.

As shown in FIG. 4, the high impedance layer 27 includes two or more third high impedance film layers 273. In the same high impedance layer 27, resistivities of the third high impedance film layers 273 are gradually decreased in the direction from the cathode layer 28 to the first high impedance film layer 271. With such arrangement, the two or more third high impedance film layers 273 can make the change of a work function from the first high impedance film layer 271 to the electron injection layer 26 more gentle, which is more helpful to reduce a difficulty of electron injection and transport, and increase an electron transport rate. In the example shown in FIG. 4, the high impedance layer 27 includes two third high impedance film layers 273. In other examples, the high impedance layer 27 may include three or more third high impedance film layers 273.

In an example, materials for the first high impedance film layer 271, the second high impedance film layer 272, and the third high impedance film layer 273 are same. With such arrangement, when the first high impedance film layer 271, the second high impedance film layer 272, and the third high impedance film layer 273 are manufactured through sputtering, the first high impedance film layer 271, the second high impedance film layer 272, and the third high impedance film layer 273 can be manufactured from the same target material, which is helpful to reduce the cost of a display substrate manufacturing process, and simplify the manufacturing process.

In an example, the materials for the first high impedance film layer 271, the second high impedance film layer 272, and the third high impedance film layer 273 are selected from at least one of zinc oxide, titanium oxide, tin oxide or indium oxide. For example, the materials for the first high impedance film layer 271, the second high impedance film layer 272, and the third high impedance film layer 273 may all be zinc oxide, and the first high impedance film layer 271, the second high impedance film layer 272, and the third high impedance film layer 273 are manufactured from the same zinc oxide target material through sputtering.

In an example, the resistivity of the first high impedance film layer 271 is in a range from $10^4$ Ω*cm to $10^6$ Ω*cm, and the resistivities of the second high impedance film layer 272 and the third high impedance film layer 273 are in a range from $10^2$ Ω*cm to $10^3$ Ω*cm respectively. With such arrangement, the high impedance layer 27 can effectively increase a resistance between the anode layer 21 and the cathode layer 28 at a location where a short circuit is more likely to occur on the periphery of the particle in the sub-pixel, while achieving a gentle change of the work function from the electron injection layer 26 to the cathode layer 28.

In an example, an absolute value of a work function of the cathode layer 28 is in a range from 3.6 eV to 4.2 eV, an absolute value of a work function of the first high impedance film layer 271 is in a range from 5.2 eV to 6.0 eV, and absolute values of work functions of the second high impedance film layer 272 and the third high impedance film layer 273 are in a range from 4.5 eV to 5.2 eV.

Figure 6:
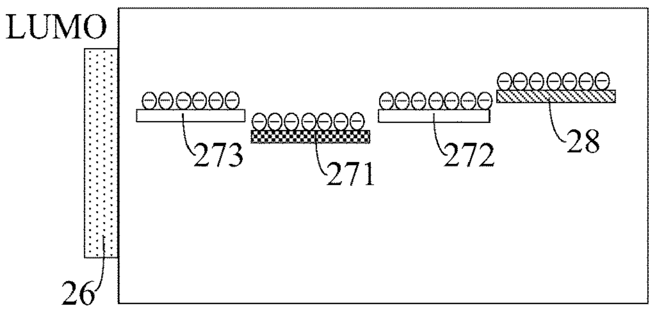
FIG. 6 is a schematic diagram illustrating electrons transporting from a cathode layer to an electron injection layer in a display substrate according to an example of the present application.

As shown in FIG. 6, the work function difference between the cathode layer 28 and the second high impedance film layer 272 is smaller, so that a difficulty of transporting electrons from the cathode layer 28 to the second high impedance film layer 272 is small; the work function difference between the second high impedance film layer 272 and the first high impedance film layer 271 is smaller, so that a difficulty of transporting electrons from the second high impedance film layer 272 to the first high impedance film layer 271 is small; the work function difference between the first high impedance film layer 271 and the third high impedance film layer 273 is smaller, so that a difficulty of transporting electrons from the first high impedance film layer 271 to the third high impedance film layer 273 is small; the work function difference between the third high impedance film layer 273 and the electron injection layer 26 is smaller, so that a difficulty of transporting electrons from the third high impedance film layer 273 to the electron injection layer 26 is small. That is, the change of a work function from the cathode layer 28 to the electron injection layer 26 is more gentle, which can reduce a difficulty of electron injection and transport, decrease an amount of electrons loss, and increase an electron transport rate.

In an example, the anode layer 21 may be a transparent film layer, and materials for the anode layer 21 are transparent conductive materials, for example, ITO (indium tin oxide). Alternatively, the anode layer 21 may include a reflective film layer and a transparent film layer. The reflective film layer is on a side of the transparent film layer away from the cathode layer 28. A material for the transparent film layer may be ITO, and a material for the reflective film layer may be Ag.

In an example, materials for the cathode layer 28 may be metals. For example, the cathode layer 28 is an Ag film layer or an Ag/Mg film layer.

In an example, the display substrate further includes a driving circuit layer between the base 10 and the light-emitting device 20. The driving circuit layer includes a plurality of pixel circuits, where the pixel circuits and the sub-pixels can correspond one to one, and each of the pixel circuits drives a corresponding sub-pixel.

In the examples shown in FIGS. 3-5, the anode layer 21 of the light-emitting device 20 is between the cathode layer 28 and the base 10. In other examples, the cathode layer 28 of the light-emitting device 20 may be between the anode layer 21 and the base 10.

Example 2

Figure 7:
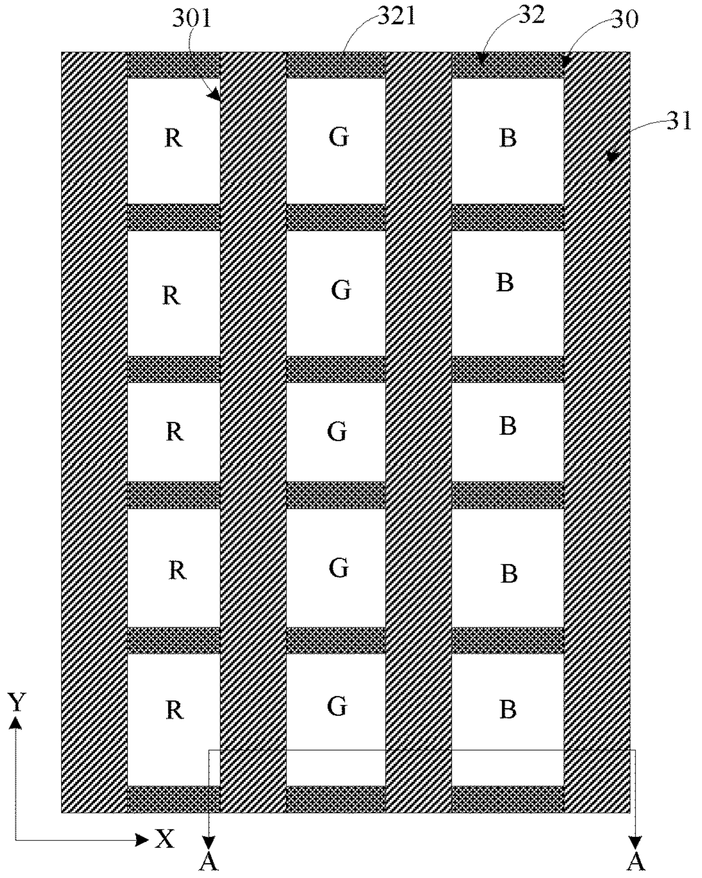
FIG. 7 is a partial schematic diagram illustrating a display substrate according to another example of the present application.
Figure 8:
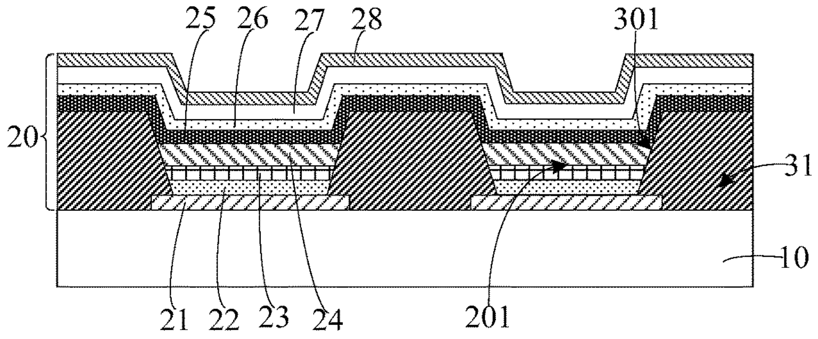
FIG. 8 is a partial cross-sectional view obtained by cutting the display substrate shown in FIG. 7 along line AA.

In the Example 2 of the present application, a display substrate is provided. As shown in FIGS. 7 and 8, the display substrate includes a base 10, and a pixel defining layer 30 and a plurality of sub-pixels 201 on the base 10. The pixel defining layer 30 includes a plurality of first defining portions 31 extending along a first direction Y and a plurality of second defining portions 32 extending along a second direction X, where the first direction Y intersects the second direction X. A distance from a surface of the first defining portion 31 away from the base 10 to the base 10 is greater than that from a surface of the second defining portion 32 away from the base 10 to the base 10. By the first defining portions 31 and the second defining portions 32, a plurality of pixel openings 301 that define light-emitting regions of the sub-pixels 201 are formed. Each of the second defining portions 32 includes a plurality of sub-defining portions 321 arranged along the second direction X, and each of the sub-defining portions 321 is between two adjacent first defining portions 31. A plurality of sub-defining portions 321 may be between the two adjacent first defining portions 31, and the plurality of sub-defining portions 321 are arranged in spacing in the first direction Y.

Each of the sub-pixels 201 includes a light-emitting device 20, and the light-emitting device 20 includes an anode layer 21, a hole injection layer 22, a hole transport layer 23, a light-emitting material layer 24, an electron transport layer 25, an electron injection layer 26 and a cathode layer 28 that are arranged sequentially. The hole injection layer 22, the hole transport layer 23, and the light-emitting material layer 24 of the sub-pixel 201 are between two adjacent first defining portions 31. That is, surfaces of the hole injection layer 22, the hole transport layer 23, and the light-emitting material layer 24 away from the base 10 are lower than a surface of the first defining portions 31 away from the base. Hole injection layers 22 of a plurality of sub-pixels 201 between the two adjacent first defining portions 31 are connected with each other. Hole transport layers 23 of the plurality of sub-pixels 201 between the two adjacent first defining portions 31 are connected with each other. Light-emitting material layers 24 of the plurality of sub-pixels 201 between the two adjacent first defining portions 31 are connected with each other.

As shown in FIGS. 3 to 5, the light-emitting device 20 includes at least one electron injection layer 26, and the light-emitting device 20 further includes at least one high impedance layer 27 between the electron injection layer 26 and the cathode layer 28. The high impedance layer 27 includes a first high impedance film layer 271, at least one second high impedance film layer 272 between the first high impedance film layer 271 and the cathode layer 28, and at least one third high impedance film layer 273 between the first high impedance film layer 271 and the electron injection layer 26. A resistivity of the first high impedance film layer 271 is respectively higher than a resistivity of the second high impedance film layer 272 and a resistivity of the third high impedance film layer 273. The resistivity of the first high impedance film layer 271, the resistivity of the second high impedance film layer 272, and the resistivity of the third high impedance film layer 273 are respectively higher than a resistivity of the cathode layer 28 and a resistivity of the electron injection layer 26.

For the display substrate provided in the example of the present application, the light-emitting device 20 includes at least one high impedance layer 27, where the resistivity of each film layer of the high impedance layer 27 is higher than the resistivity of each layer which is adjacent with the high impedance layer, that is, the resistivity of each film layer of the high impedance layer 27 is higher than the resistivity of the electron injection layer 26 and the cathode layer 28. The high impedance layer 27 can modify a periphery of a particle in the sub-pixel, increasing a resistance between the anode layer 21 and the cathode layer 28 at a location where a short circuit is more likely to occur due to the presence of the particle in the sub-pixel, and thereby greatly alleviating a short circuit problem of sub-pixels due to the presence of the particle, effectively reducing a number of dark spots generated on the display substrate, and improving a product yield of the display substrate. In the high impedance layer 27, the resistivity of at least one second high impedance film layer 272 between the first high impedance film layer 271 and the cathode layer 28 is lower than the resistivity of the first high impedance film layer 271, and the resistivity of at least one third high impedance film layer 273 between the first high impedance film layer 271 and the electron injection layer 26 is lower than the resistivity of the first high impedance film layer 271, so that both a work function difference between the cathode layer 28 and the second high impedance film layer 272 and a work function difference between the first high impedance film layer 271 and the second high impedance film layer 272 are smaller than that between the cathode layer 28 and the first high impedance film layer 271, and both a work function difference between the first high impedance film layer 271 and the third high impedance film layer 273 and a work function difference between the third high impedance film layer 273 and the electron injection layer 26 are smaller than that between the first high impedance film layer 271 and the electron injection layer 26, that is, the change of a work function from the electron injection layer 26 to the cathode layer 28 is more gentle, which can reduce a difficulty of injecting electrons from the cathode layer 28 to the first high impedance film layer 271 and a difficulty of injecting electrons from the first high impedance film layer 271 to the electron injection layer 26, increase an electron transport rate, and alleviate problems of high driving voltage and low optical performance of a light-emitting substrate due to a low electron transport rate.

In an example, the first direction Y and the second direction X may be perpendicular to each other. For example, the first direction Y is a column direction, and the second direction X is a row direction.

In an example, the display substrate includes sub-pixels 201 with at least three different light-emitting colors, and the sub-pixels with at least three different light-emitting colors include, for example, sub-pixels with a first color, sub-pixels with a second color, and sub-pixels with a third color. The first color, the second color and the third color are three primary colors, and the three primary colors are, for example, red, green and blue.

In an example, the hole injection layers 22, the hole transport layers 23, and the light-emitting material layers 24 of the display substrate are formed through inkjet printing. A plurality of sub-pixels 201 between two adjacent first defining portions 31 have the same light-emitting color. As shown in FIG. 6, three adjacent columns of sub-pixels may be red sub-pixels R, green sub-pixels G, and blue sub-pixels B respectively.

When the hole injection layers 22 are formed through inkjet printing, ink flows between two adjacent first defining portions 31, and crosses the second defining portions 32 between adjacent sub-pixels 201 during the ink flowing, so that the hole injection layers 22 of a plurality of sub-pixels 201 between the two adjacent first defining portions 31 are connected with each other. Similarly, when the hole transport layers 23 are formed through inkjet printing, the hole transport layers 23 of a plurality of sub-pixels 201 between the two adjacent first defining portions 31 are connected with each other, and when the light-emitting material layers 24 are formed through inkjet printing, the light-emitting material layers 24 of a plurality of sub-pixels 201 between the two adjacent first defining portions 31 are connected with each other. In the second direction X, the hole injection layers 22, the hole transport layers 23, and the light-emitting material layers 24 of adjacent sub-pixels are separated by the first defining portions 31.

In an example, a thickness of at least one of the hole injection layer 22, the hole transport layer 23, or the light-emitting material layer 24 for the sub-pixel 201 with one light-emitting color is different from that with another light-emitting color. In this way, luminous efficiencies of the sub-pixels 201 with different light-emitting colors can be improved respectively.

In some examples, a thickness of the hole injection layers 22 of the red sub-pixels R is respectively larger than a thickness of the hole injection layers 22 of the green sub-pixels G and a thickness of the hole injection layers 22 of the blue sub-pixels B. When the hole injection layers 22 are manufactured through inkjet printing, the hole injection layers 22 of the red sub-pixels R can be formed separately in one inkjet printing process. When the thicknesses of the hole injection layers 22 of the green sub-pixels G and the blue sub-pixels B are same and materials therefor are same, the hole injection layers 22 of the green sub-pixels G and the blue sub-pixels B can be formed in one inkjet printing process. In an example, the thickness of the hole injection layers 22 of the red sub-pixels R is 12 nm, and the thicknesses of the hole injection layers 22 of the green sub-pixels G and the hole injection layers 22 of the blue sub-pixels B are 6 nm.

In some examples, a thickness of the hole transport layers 23 of the red sub-pixels R is larger than a thickness of the hole transport layers 23 of the green sub-pixels G, and the thickness of the hole transport layers 23 of the green sub-pixels G is larger than the thickness of the hole transport layers 23 of the blue sub-pixels B. When the hole transport layers 23 are manufactured through inkjet printing, the hole transport layers 23 of the red sub-pixels R, the hole transport layers 23 of the green sub-pixels G, and the hole transport layers 23 of the blue sub-pixels B are formed respectively in different inkjet printing processes. In an example, the thickness of the hole transport layers 23 of the red sub-pixels R is 21 nm, the thickness of the hole transport layers 23 of the green sub-pixels G is 16 nm, and the thickness of the hole transport layers 23 of the blue sub-pixels B is 11 nm.

In some examples, a thickness of the light-emitting material layers 24 of the red sub-pixels R is larger than that of the light-emitting material layers 24 of the green sub-pixels G, and the thickness of the light-emitting material layers 24 of the green sub-pixels G is larger than that of the light-emitting material layers 24 of the blue sub-pixels B. When the light-emitting material layers 24 are manufactured through inkjet printing, the light-emitting material layers 24 of the red sub-pixels R, the light-emitting material layers 24 of the green sub-pixels G, and the light-emitting material layers 24 of the blue sub-pixels B are formed respectively in different inkjet printing processes. In an example, the thickness of the light-emitting material layers 24 of the red sub-pixels R is 87 nm, the thickness of the light-emitting material layers 24 of the green sub-pixels G is 63 nm, and the thickness of the light-emitting material layers 24 of the blue sub-pixels B is 55 nm.

In an example, the electron transport layer 25, the electron injection layer 26, and the cathode layer 28 may be common layers, that is, a film layer covered on the full surface. The electron transport layer 25 and the electron injection layer 26 may be formed through evaporation.

In an example, a thickness of the first high impedance film layer 271 is larger than a thickness of the second high impedance film layer 272 and a thickness of the third high impedance film layer 273.

In some examples, the thickness of the first high impedance film layer 271 is in a range from 50 nm to 200 nm, the thickness of the second high impedance film layer 272 is in a range from 5 nm to 10 nm, and the thickness of the third high impedance film layer 273 is in a range from 5 nm to 10 nm.

In an example, the high impedance layer 27 includes two or more second high impedance film layers 272. In one high impedance layer 27, resistivities of the second high impedance film layers 272 are gradually increased in a direction from the cathode layer 28 to the first high impedance film layer 271.

In an example, the high impedance layer 27 includes two or more third high impedance film layers 273. In one high impedance layer 27, resistivities of the third high impedance film layers 273 are gradually decreased in the direction from the cathode layer 28 to the first high impedance film layer 271.

In an example, materials for the first high impedance film layer 271, the second high impedance film layer 272, and the third high impedance film layer 273 are same.

In an example, when a number of the cathode layer 28 and the high impedance layer 27 is greater than or equal to two, the cathode layers 28 and the high impedance layers 27 are alternately arranged.

In an example, the resistivity of the first high impedance film layer 271 is in a range from $10^4$ Ω*cm to $10^6$ Ω*cm, and the resistivities of the second high impedance film layer 272 and the third high impedance film layer 273 are in a range from $10^2$ Ω*cm to $10^3$ Ω*cm respectively.

In an example, an absolute value of a work function of the cathode layer 28 is in a range from 3.6 eV to 4.2 eV, an absolute value of a work function of the first high impedance film layer 271 is in a range from 5.2 eV to 6.0 eV, and absolute values of work functions of the second high impedance film layer 272 and the third high impedance film layer 273 are in a range from 4.5 eV to 5.2 eV.

The display substrate provided in the Example 2 of the present application and the display substrate provided in the Example 1 of the present application belong to the same inventive concept, and for the description of their relevant details and beneficial effects, mutual reference may be made, without further elaboration.

Example 3

In the Example 3 of the present application, a method for manufacturing a display substrate is provided. The method for manufacturing a display substrate includes the following steps:

First, a base is provided.

Subsequently, a light-emitting device located on the base is formed.

The step of forming the light-emitting device located on the base includes: sequentially forming an anode layer, a hole injection layer, a hole transport layer, a light-emitting material layer, an electron transport layer, an electron injection layer, a high impedance layer and a cathode layer. The light-emitting device includes at least one electron injection layer, and at least one high impedance layer located between the electron injection layer and the cathode layer.

The step of forming the high impedance layer includes: sequentially forming at least one third high impedance film layer, a first high impedance film layer located at a side of the at least one third high impedance film layer away from the anode layer, and at least one second high impedance film layer located at a side of the first high impedance film layer away from the anode layer. A resistivity of the first high impedance film layer is respectively higher than a resistivity of the second high impedance film layer and resistivity of the third high impedance film layer. The resistivity of the first high impedance film layer, the resistivity of the second high impedance film layer, and the resistivity of the third high impedance film layer are respectively higher than resistivity of the cathode layer and resistivity of the electron injection layer.

In an example, after the anode layer is formed, the step of forming the light-emitting device located on the base further includes: forming a pixel defining layer. As shown in FIG. 7, the step of forming the pixel defining layer 30 includes: forming a plurality of first defining portions 31 extending along a first direction Y and a plurality of second defining portions 32 extending along a second direction X, where the first direction Y intersects the second direction X. The order of forming the first defining portions 31 and the second defining portions 32 is not limited. The first defining portions 31 may be formed first, and then the second defining portions 32 are formed, or the second defining portions 32 may be formed first, and then the first defining portions 31 are formed.

A distance from a surface of the first defining portion 31 away from the base 10 to the base 10 are greater than a distance from a surface of the second defining portion 32 away from the base 10 to the base 10. By the first defining portions 31 and the second defining portions 32, a plurality of pixel openings 301 that define light-emitting regions of sub-pixels 201 are formed. Each of the second defining portions 32 includes a plurality of sub-defining portions 321 arranged along the second direction X, and each of the sub-defining portions 321 is located between two adjacent first defining portions 31.

In an example, the display substrate include sub-pixels with at least three different light-emitting colors. For example, the light-emitting devices include sub-pixels with a first color, sub-pixels with a second color, and sub-pixels with a third color. The first color may be red, the second color may be green, and the third color may be blue. A plurality of sub-pixels located between two adjacent first defining portions 31 and arranged spaced along the first direction Y have the same color.

In an example, the hole transport layer, the hole injection layer, and the light-emitting material layer may be formed through inkjet printing, and the electron transport layer and the electron injection layer may be formed through evaporation.

In an example, a process of manufacturing the hole injection layer may be as follows.

The hole injection layer of the sub-pixel with the first color, hole injection layer of the sub-pixel with the second color, and hole injection layer of the sub-pixel with the third color are printed sequentially through inkjet printing. The hole injection layer of the sub-pixel with the first color, the hole injection layer of the sub-pixel with the second color, and the hole injection layer of the sub-pixel with the third color can be printed with the same ink or different inks. The hole injection layers of the sub-pixels with various colors, after being inkjet printed, are subjected to vacuum drying and baking.

In an example, the same ink may be used for the hole injection layer of the sub-pixel with the first color, the hole injection layer of the sub-pixel with the second color, and the hole injection layer of the sub-pixel with the third color, or different inks may be used therefor according to structural differences, and subsequent processing conditions for using the different inks (for example, a baking temperature) are same. All the hole injection layers of the sub-pixels with three different colors, after being inkjet printed, can be uniformly subjected to VCD (Vacuum Concentration Drying) vacuum drying and then baking. The order of inkjet printing the hole injection layers of the sub-pixels with three colors can be changed, without strict limitation.

In an example, when different inks are used for the hole injection layer of the sub-pixel with the first color, the hole injection layer of the sub-pixel with the second color, and the hole injection layer of the sub-pixel with the third color according to structural differences, and subsequent processing conditions for using the different inks (for example, a baking temperature) are different, the specific manufacturing process may be as follows.

The hole injection layers of the sub-pixels with the first color are printed through inkjet printing and subjected to vacuum drying and baking. The baking temperature is a first temperature.

The hole injection layers of the sub-pixels with the second color are printed through inkjet printing and subjected to vacuum drying and baking. The baking temperature is a second temperature.

The hole injection layers of the sub-pixels with the third color are printed through inkjet printing and subjected to vacuum drying and baking. The baking temperature is a third temperature.

The first temperature, the second temperature and the third temperature may be all different. For example, the first temperature is greater than the second temperature, and the second temperature is greater than the third temperature. That is to say, the hole injection layers of the sub-pixels with different colors can be printed according to baking temperatures of inks. First, the hole injection layers of the sub-pixels with the first color that require a high baking temperature are printed and thereafter subjected to VCD vacuum drying and high-temperature baking. Then, the hole injection layers of the sub-pixels with the second color that require a sub-high baking temperature are printed and subjected to VCD vacuum drying and baking. Finally, the hole injection layers of the sub-pixels with the third color that require a lowest baking temperature are printed and subjected to corresponding VCD vacuum drying and baking.

In an example, a process of manufacturing hole transport layers may be as follows.

Hole transport layer of the sub-pixel with the first color, hole transport layer of the sub-pixel with the second color, and hole transport layer of the sub-pixel with the third color are printed sequentially through inkjet printing. The hole transport layer of the sub-pixel with the first color, the hole transport layer of the sub-pixel with the second color, and the hole transport layer of the sub-pixel with the third color can be printed with the same ink or different inks. The hole transport layers of the sub-pixels with the first color, the hole transport layers of the sub-pixels with the second color, and the hole transport layers of the sub-pixels with the third color, after being inkjet printed, are subjected to vacuum drying and baking.

In the above solution, the same ink may be used for the hole transport layer of the sub-pixel with the first color, the hole transport layer of the sub-pixel with the second color, and the hole transport layer of the sub-pixel with the third color, or different inks may be used therefor according to structural differences, and subsequent processing conditions for using the different inks (for example, a baking temperature) are same. All the hole transport layers of the sub-pixels with three colors, after being inkjet printed, can be together subjected to VCD vacuum drying and then baking. The order of inkjet printing the hole transport layers of the sub-pixels with three colors can be changed, without strict limitation.

In an example, when different inks are used for the hole transport layer of the sub-pixel with the first color, the hole transport layer of the sub-pixel with the second color, and the hole transport layer of the sub-pixel with the third color according to structural differences, and subsequent processing conditions for using the different inks (for example, a baking temperature) are different, the specific manufacturing process may be as follows:

The hole transport layers of the sub-pixels with the first color are printed through inkjet printing and subjected to vacuum drying and baking. The baking temperature is a fourth temperature.

The hole transport layers of the sub-pixels with the second color are printed through inkjet printing and subjected to vacuum drying and baking. The baking temperature is a fifth temperature.

The hole transport layers of the sub-pixels with the third color are printed through inkjet printing and subjected to vacuum drying and baking. The baking temperature is a sixth temperature.

The fourth temperature, the fifth temperature and the sixth temperature may be all different. For example, the fourth temperature is greater than the fifth temperature, and the fifth temperature is greater than the sixth temperature. That is to say, the hole transport layers of the sub-pixels with the first color, the hole transport layers of the sub-pixels with the second color, and the hole transport layers of the sub-pixels with the third color can be printed according to baking temperatures of inks. First, the hole transport layers of the sub-pixels with the first color that require a high baking temperature are printed and thereafter subjected to VCD vacuum drying and high-temperature baking. Then, the hole transport layers of the sub-pixels with the second color that require a sub-high baking temperature are printed and subjected to VCD vacuum drying and baking. Finally, the hole transport layers of the sub-pixels with the third color that require a lowest baking temperature are printed and subjected to corresponding VCD vacuum drying and baking.

In an example, materials for the hole transport layers are p-type organic semiconductor materials, and aromatic amine compounds may be used as specific materials to prepare inks, including the following materials and blend materials having one or two material which is obtained by modifying or optimizing substituents of one of the following materials.

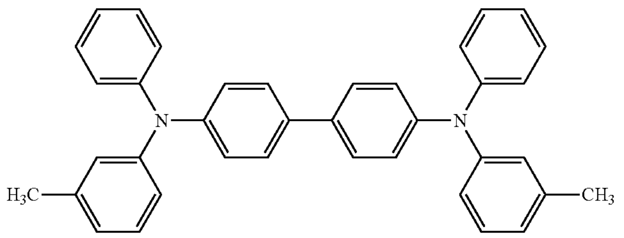

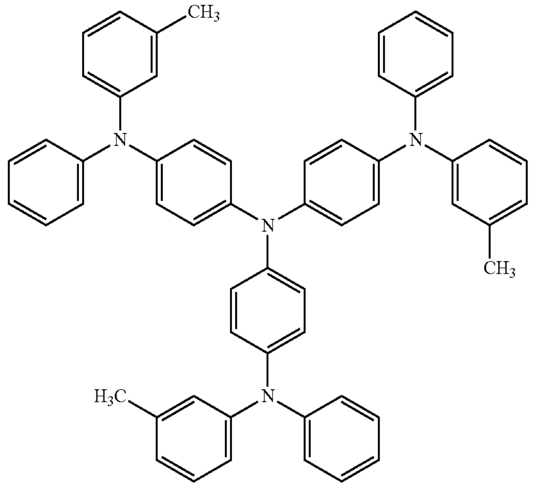

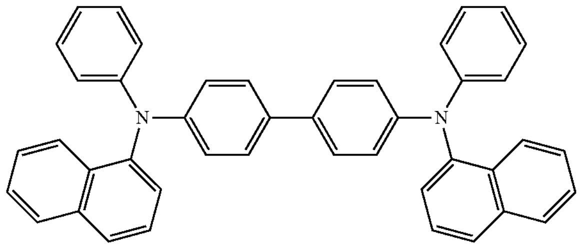

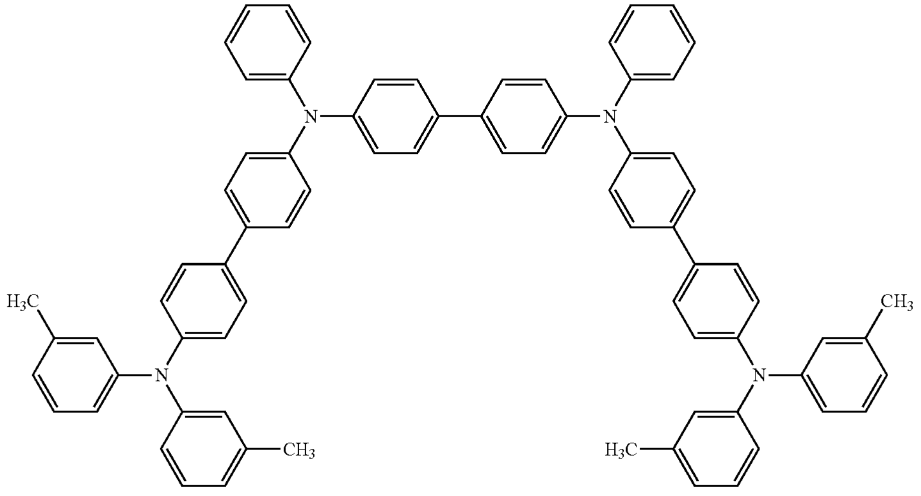

TPTE

In an example, a process of manufacturing light-emitting material layers may be as follows.

Light-emitting material layer of the sub-pixel with the first color, light-emitting material layer of the sub-pixel with the second color, and light-emitting material layer of the sub-pixel with the third color are printed sequentially through inkjet printing. The light-emitting material layer of the sub-pixel with the first color, the light-emitting material layer of the sub-pixel with the second color, and the light-emitting material layer of the sub-pixel with the third color can be printed with the same ink or different inks. The light-emitting material layers of the sub-pixels with the first color, the light-emitting material layers of the sub-pixels with the second color, and the light-emitting material layers of the sub-pixels with the third color, after being inkjet printed, are subjected to vacuum drying and baking.

In the above solution, the same ink may be used for the light-emitting material layer of the sub-pixel with the first color, the light-emitting material layer of the sub-pixel with the second color, and the light-emitting material layer of the sub-pixel with the third color, or different inks may be used therefor according to structural differences, and subsequent processing conditions for using the different inks (for example, a baking temperature) are same. All the light-emitting material layers of the sub-pixels with three colors, after being inkjet printed, can be uniformly subjected to VCD vacuum drying and then baking. The order of inkjet printing the light-emitting material layers of the sub-pixels with three colors can be changed, without strict limitation.

Of course, it can be understood that, when different inks are used for the light-emitting material layer of the sub-pixel with the first color, the light-emitting material layer of the sub-pixel with the second color, and the light-emitting material layer of the sub-pixel with the third color according to structural differences, and subsequent processing conditions for using the different inks (for example, a baking temperature) are different, the specific manufacturing process may be as follows.

The light-emitting material layers of the sub-pixels with the first color are printed through inkjet printing and subjected to vacuum drying and baking. The baking temperature is a seventh temperature.

The light-emitting material layers of the sub-pixels with the second color are printed through inkjet printing and subjected to vacuum drying and baking. The baking temperature is an eighth temperature.

The light-emitting material layers of the sub-pixels with the third color are printed through inkjet printing and subjected to vacuum drying and baking. The baking temperature is a ninth temperature.

The seventh temperature, the eighth temperature and the ninth temperature may be all different. For example, the seventh temperature is greater than the eighth temperature, and the eighth temperature is greater than the ninth temperature. That is to say, the light-emitting material layers of the sub-pixels with the first color, the light-emitting material layers of the sub-pixels with the second color, and the light-emitting material layers of the sub-pixels with the third color can be printed according to baking temperatures of inks. First, the light-emitting material layers of the sub-pixels with the first color that require a high baking temperature are printed and thereafter subjected to VCD vacuum drying and high-temperature baking. Then, the light-emitting material layers of the sub-pixels with the second color that require a sub-high baking temperature are printed and subjected to VCD vacuum drying and baking. Finally, the light-emitting material layers of the sub-pixels with the third color that require a lowest baking temperature are printed and subjected to corresponding VCD vacuum drying and baking.

In an example, the electron transport layer and the electron injection layer are common layers, and may be formed through evaporation. Materials for the electron injection layer are n-type organic semiconductor materials, and specific materials for the electron injection layer may be selected from the following materials and blend materials having one or two material which is obtained by modifying and optimizing substituents of one of the following materials.

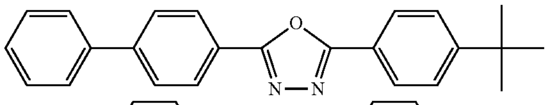

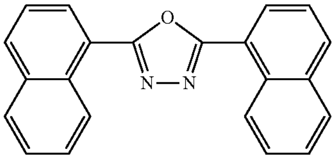

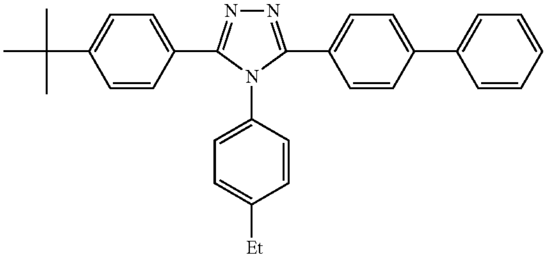

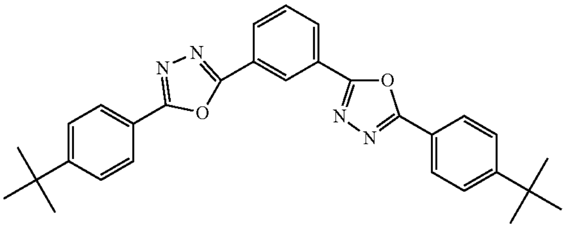

In an example, the cathode layer may be formed through evaporation, and a metal thin film, for example, an Ag or Ag/Mg film layer, may be selected as the cathode layer. In an example, the cathode layer may be formed through sputtering, and a transparent conductive oxide thin film with a low impedance, for example, an IZO (indium zinc oxide) or $In_2O_3$ (indium oxide) film layer, may be selected as the cathode layer.

In an example, each film layer of the high impedance layer 27 is formed through sputtering. The high impedance layer 27 formed through sputtering has a better coating effect on a particle in a sub-pixel, which is more helpful to avoid the case where the anode layer 21 and the cathode layer 28 of the sub-pixel are short-circuited, and reduce a number of dark spots generated on the display substrate.

In an example, sputtering gases used for sputtering are oxygen and argon, and a proportion of oxygen in the sputtering gases is less than or equal to 10%.

In an example, in a sputtering process of manufacturing the first high impedance film layer, the proportion of oxygen in the sputtering gases is a first proportion; in a sputtering process of manufacturing the second high impedance film layer, the proportion of oxygen in the sputtering gases is a second proportion; and in a sputtering process of manufacturing the third high impedance film layer, the proportion of oxygen in the sputtering gases is a third proportion, where the first proportion is respectively greater than the second proportion and the third proportion. With such arrangement, it can be allowed that the resistivity of the first high impedance film layer is respectively higher than the resistivity of the second high impedance film layer and the resistivity of the third high impedance film layer.

In an example, a power density used in the sputtering process of manufacturing the first high impedance film layer is a first power density, a power density used in the sputtering process of manufacturing the second high impedance film layer is a second power density, and a power density used in the sputtering process of manufacturing the third high impedance film layer is a third power density, where the first power density is respectively smaller than the second power density and the third power density. With such arrangement, it can be allowed that the resistivity of the first high impedance film layer is respectively higher than the resistivity of the second high impedance film layer and the resistivity of the third high impedance film layer.

In an example, materials for the first high impedance film layer 271, the second high impedance film layer 272, and the third high impedance film layer 273 are selected from at least one of zinc oxide, titanium oxide, tin oxide or indium oxide.

When zinc oxide and titanium oxide are used as the materials for the high impedance film layers, different high impedance film layers are obtained by changing film forming conditions in the sputtering process. Test results for the different high impedance film layers are shown in Table 1.

TABLE 1

| Main ingredients | Sample No. | Conditions for forming films: gas type | Gas pressure (Pa) | power density (w/cm$^2$) | Thickness (nm) | Resistivity (Ω · cm) Reference value | Work function (eV) First Measurement | Work function (eV) Second measurement |
|---|---|---|---|---|---|---|---|---|
| ZnO | Sample 1 | 2% $O_2$ | 0.5 | 5.5 | 225 | 1.50E+04 | 5.44 | — |
| | Sample 2 | 3% $O_2$ | 0.5 | 5.5 | 207 | 2.90E+06 | 5.52 | 5.55 |
| | Sample 3 | 2% $O_2$ | 0.5 | 4.1 | 201 | 7.20E+07 | 5.44 | — |
| $TiO_2$ | Sample 4 | 1% $O_2$ | 0.5 | 5.5 | 202 | 1.50E+04 | 5.24 | — |
| | Sample 5 | 2% $O_2$ | 0.5 | 8.2 | 209 | 1.50E+06 | 5.31 | — |
| | Sample 6 | 2% $O_2$ | 0.5 | 5.5 | 182 | 1.60E+09 | 5.60 | — |

The gas type in Table 1 refers to the proportion of oxygen in the sputtering gases, which are a mixture of oxygen and argon. As can be seen from Table 1, when the materials for the high impedance film layers are same, resistivities and work functions of the obtained high impedance film layers can be changed by changing the proportion of oxygen in the sputtering gases and the power density.

In an example, the first high impedance film layer, the second high impedance film layer, and the third high impedance film layer in the high impedance layer are manufactured from the same target material. With such arrangement, there is no need to replace the target material during the manufacturing of the high impedance layer, which is helpful to simplify the manufacturing process and reduce the manufacturing cost. The method for manufacturing a display substrate provided in the Example 3 of the present application belongs to the same inventive concept as the display substrate provided in the above two examples, and for the description of their relevant details and beneficial effects, mutual reference may be made.

In an example of the present application, a display device is provided, including the display substrate as described above.

In an example, the display device further includes a cover plate located on a side of the display substrate away from a base.

In an example, the display device may further include a housing, into which the display substrate is embedded.

The display device in the examples may be any product or component having a display function, such as electronic paper, a mobile phone, a tablet computer, a television, a notebook computer, a digital photo frame, or an onboard display device.

It should be pointed out that, in the drawings, sizes of layers and areas may be exaggerated for clarity of illustration. It will also be understood that when an element or layer is referred to as being "on" another element or layer, it can be directly on other element, or an intermediate layer may be present. In addition, it will be understood that when an element or layer is referred to as being "below" another element or layer, it can be directly below other element, or more than one intermediate layer or element may be present. In addition, it will also be understood that when a layer or element is referred to as being "between" two layers or elements, it can be the only layer between the two layers or elements, or more than one intermediate layer or element may be present. Similar reference signs indicate similar elements throughout.

In the present application, terms "first" and "second" are used only for descriptive purposes, and cannot be understood as indicating or implying relative importance. Terms "multiple" and "plurality" refer to two or more, unless otherwise explicitly defined.

Other embodiments of the present application will be readily apparent to those skilled in the art after considering the specification and practicing the contents disclosed herein. The present application is intended to cover any variations, uses, or adaptable changes of the present application, which follow the general principle of the present application and include common knowledge or conventional technical means in the art that are not disclosed in the present application. The specification and examples are to be regarded as illustrative only. The true scope and spirit of the present application are pointed out by the following claims.

It is to be understood that the present application is not limited to the precise structures that have described and shown in the drawings, and various modifications and changes can be made without departing from the scope thereof. The scope of the application is to be limited only by the appended claims.

The invention claimed is:

1. A display substrate, comprising: a base and sub-pixels located on the base, each of the sub-pixels comprising a light-emitting device, wherein the light-emitting device comprises an anode layer, a light-emitting material layer, an electron transport layer, an electron injection layer and a cathode layer that are arranged sequentially; the light-emitting device comprises at least one electron injection layer, and the light-emitting device further comprises at least one high impedance layer located between the electron injection layer and the cathode layer;

for one of the at least one high impedance layer, the high impedance layer comprises a first high impedance film layer, a second high impedance film layer between the first high impedance film layer and the cathode layer, and a third high impedance film layer between the first high impedance film layer and the electron injection layer; a resistivity of the first high impedance film layer is respectively higher than a resistivity of the second high impedance film layer and a resistivity of the third high impedance film layer; the resistivity of the first high impedance film layer, the resistivity of the second high impedance film layer, and the resistivity of the third high impedance film layer are respectively higher than a resistivity of the cathode layer and a resistivity of the electron injection layer;

wherein a thickness of the first high impedance film layer is respectively larger than a thickness of the second high impedance film layer and a thickness of the third high impedance film layer.

2. The display substrate according to claim 1, wherein the thickness of the first high impedance film layer is in a range from 50 nm to 200 nm, the thickness of the second high impedance film layer is in a range from 5 nm to 10 nm, and the thickness of the third high impedance film layer is in a range from 5 nm to 10 nm.

3. The display substrate according to claim 1, wherein, the high impedance layer comprises two or more second high impedance film layers comprising the second high impedance film layer, and in the high impedance layer, resistivities of the two or more second high impedance film layers are gradually increased in a direction from the cathode layer to the first high impedance film layer.

4. The display substrate according to claim 1, wherein, the high impedance layer comprises two or more third high impedance film layers comprising the third high impedance film layer, and in the high impedance layer, resistivities of the two or more third high impedance film layers are gradually decreased in a direction from the cathode layer to the first high impedance film layer.

5. The display substrate according to claim 1, wherein materials for the first high impedance film layer, the second high impedance film layer and the third high impedance film layer are same.

6. The display substrate according to claim 1, wherein materials for the first high impedance film layer, the second high impedance film layer and the third high impedance film layer are selected from at least one of zinc oxide, titanium oxide, tin oxide or indium oxide.

7. The display substrate according to claim 1, wherein, a number of the electron injection layer and a number of the high impedance layer are both greater than or equal to two, and the electron injection layers and the high impedance layers are alternately arranged.

8. The display substrate according to claim 1, wherein the resistivity of the first high impedance film layer is in a range from $10^4$ Ω*cm to $10^6$ Ω*cm, and the resistivity of the second high impedance film layer and the resistivity of the third high impedance film layer are in a range from $10^2$ Ω*cm to $10^3$ Ω*cm respectively.

9. The display substrate according to claim 1, wherein an absolute value of a work function of the cathode layer is in a range from 3.6 eV to 4.2 eV, an absolute value of a work function of the first high impedance film layer is in a range from 5.2 eV to 6.0 eV, and absolute values of work functions of the second high impedance film layer and the third high impedance film layer are in a range from 4.5 eV to 5.2 eV respectively.

10. A display device, comprising: a display substrate according to claim 1.

11. A display substrate, comprising: a base, and a pixel defining layer and sub-pixels on the base, wherein the pixel defining layer comprises first defining portions along a first direction and second defining portions along a second direction, wherein the first direction intersects the second direction; a distance from a surface of one of the first defining portions away from the base to the base are greater than a distance from a surface of one of the second defining portions away from the base to the base; by the first defining portions and the second defining portions, a plurality of pixel openings that define light-emitting regions of the sub-pixels are formed;

one of the sub-pixels comprises a light-emitting device, and the light-emitting device comprises an anode layer, a hole injection layer, a hole transport layer, a light-emitting material layer, an electron transport layer, an electron injection layer and a cathode layer that are arranged sequentially; the hole injection layer, the hole transport layer, and the light-emitting material layer of the one of the sub-pixels are located between two adjacent first defining portions; hole injection layers of the sub-pixels between the two adjacent first defining portions are connected with each other; hole transport layers of the sub-pixels located between the two adjacent first defining portions are connected with each other; light-emitting material layers of the sub-pixels located between the two adjacent first defining portions are connected with each other;

the light-emitting device comprises at least one electron injection layer, and the light-emitting device further comprises at least one high impedance layer between the electron injection layer and the cathode layer; for one of the at least one electron injection layer, the high impedance layer comprises a first high impedance film layer, a second high impedance film layer between the first high impedance film layer and the cathode layer, and a third high impedance film layer located between the first high impedance film layer and the electron injection layer; a resistivity of the first high impedance film layer is respectively higher than a resistivity of the second high impedance film layer and a resistivity of the third high impedance film layer; the resistivity of the first high impedance film layer, the resistivity of the second high impedance film layer, and the resistivity of the third high impedance film layer are respectively higher than a resistivity of the cathode layer and a resistivity of the electron injection layer.

12. The display substrate according to claim 11, wherein a thickness of the first high impedance film layer is respectively larger than a thickness of the second high impedance film layer and a thickness of the third high impedance film layer.

13. The display substrate according to claim 11, wherein, the high impedance layer comprises two or more second high impedance film layers comprising the second high impedance film layer, and in the high impedance layer, resistivities of the two or more second high impedance film layers are gradually increased in a direction from the cathode layer to the first high impedance film layer; and/or the high impedance layer comprises two or more third high impedance film layers comprising the third high impedance film layer, in the high impedance layer, resistivities of the two or more third high impedance film layers are gradually decreased in the direction from the cathode layer to the first high impedance film layer.

14. The display substrate according to claim 11, wherein materials for the first high impedance film layer, the second high impedance film layer and the third high impedance film layer are same.

15. The display substrate according to claim 11, wherein, a number of the electron injection layer and a number of the high impedance layer are both greater than or equal to two, and the electron injection layers and the high impedance layers are alternately arranged.

16. A method of manufacturing a display substrate, comprising:

providing a base;

forming a light-emitting device located on the base;

wherein forming the light-emitting device located on the base comprises: sequentially forming an anode layer, a light-emitting material layer, an electron transport layer, an electron injection layer, a high impedance layer and a cathode layer; the light-emitting device comprises at least one electron injection layer and at least one high impedance layer, the at least one high impedance layer is located between the electron injection layer and the cathode layer;

forming one of the at least one high impedance layer comprises: sequentially forming a third high impedance film layer, a first high impedance film layer located on a side of the third high impedance film layer away from the anode layer, and a second high impedance film layer located on a side of the first high impedance film layer away from the anode layer; wherein a resistivity of the first high impedance film layer is respectively higher than a resistivity of the second high impedance film layer and a resistivity of the third high impedance film layer; the resistivity of the first high impedance film layer, the resistivity of the second high impedance film layer, and the resistivity of the third high impedance film layer are respectively higher than a resistivity of the cathode layer and a resistivity of the electron injection layer;

wherein a thickness of the first high impedance film layer is respectively larger than a thickness of the second high impedance film layer and a thickness of the third high impedance film layer.

17. The method according to claim 16, wherein each film layer of the high impedance layer is formed through sputtering.

18. The method according to claim 17, wherein, in a sputtering process of manufacturing the first high impedance film layer, a proportion of oxygen in sputtering gases is a first proportion; in a sputtering process of manufacturing the second high impedance film layer, a proportion of oxygen in the sputtering gases is a second proportion; and in a sputtering process of manufacturing the third high impedance film layer, a proportion of oxygen in the sputtering gases is a third proportion, wherein the first proportion is respectively greater than the second proportion and the third proportion; and/or a power density used in a sputtering process of manufacturing the first high impedance film layer is a first power density; a power density used in a sputtering process of manufacturing the second high impedance film layer is a second power density; and a power density used in a sputtering process of manufacturing the third high impedance film layer is a third power density, wherein the first power density is respectively smaller than the second power density and the third power density.

* * * * *